United States Patent

Aggas et al.

[11] Patent Number: 5,994,157
[45] Date of Patent: Nov. 30, 1999

[54] METHOD OF MAKING A LARGE AREA IMAGER WITH UV BLOCKING LAYER, AND CORRESPONDING IMAGER

[75] Inventors: Steven Aggas, Pinckney; Willem den Boer, Plymouth; Yiwei Lu, Ann Arbor; Scott V. Thomsen, Milford, all of Mich.

[73] Assignee: OIS Optical Imaging Systems, Inc., Northville, Mich.

[21] Appl. No.: 09/010,639

[22] Filed: Jan. 22, 1998

[51] Int. Cl.[6] .................................................. H01L 21/00
[52] U.S. Cl. ................................................ 438/30; 438/73
[58] Field of Search .................................. 438/30, 32, 37, 438/73, 75, 80, 149, 152, 160

[56] References Cited

U.S. PATENT DOCUMENTS

| | | | |
|---|---|---|---|
| 4,618,380 | 10/1986 | Alcorn et al. | 148/187 |
| 4,672,454 | 6/1987 | Cannella et al. . | |
| 4,736,234 | 4/1988 | Boulitrop et al. | 357/30 |
| 5,003,356 | 3/1991 | Wakai et al. . | |
| 5,010,027 | 4/1991 | Possin et al. | 437/41 |
| 5,079,426 | 1/1992 | Antonuk et al. . | |
| 5,273,910 | 12/1993 | Tran et al. | 437/3 |
| 5,319,206 | 6/1994 | Lee et al. . | |
| 5,331,179 | 7/1994 | Lee et al. . | |
| 5,396,072 | 3/1995 | Schiebel et al. . | |
| 5,498,880 | 3/1996 | Lee et al. . | |
| 5,525,527 | 6/1996 | Tran | 437/2 |
| 5,585,200 | 12/1996 | Kwasnick et al. | 437/4 |
| 5,598,004 | 1/1997 | Powell et al. . | |
| 5,619,033 | 4/1997 | Weisfield . | |
| 5,621,556 | 4/1997 | Fulks et al. . | |
| 5,641,974 | 6/1997 | den Boer et al. . | |
| 5,827,757 | 10/1998 | Robinson, Jr. et al. | 438/73 |

*Primary Examiner*—Richard Booth
*Assistant Examiner*—Michael S. Lebentritt
*Attorney, Agent, or Firm*—Joseph A. Rhoa

[57] ABSTRACT

This invention is related to a radiation imager (e.g. X-ray imager) including a thin film transistor (TFT) array, and method of making same. A photo-imageable insulating material having a low dielectric constant is provided in areas of overlap between electrodes and underlying TFTs, diodes, and/or address lines in order to improve the signal-to-noise ratio of the imager. The photo-imageable insulating layer acts as a negative resist in certain embodiments, so that vias are formed therein by exposing portions of the insulating layer with UV light which are to remain on the substrate, removing non-exposed areas of the insulating layer so as to form the vias or apertures in the insulating layer. In order to prevent non-uniformities from inadvertently being imaged into the photo-imageable insulating layer, an ultraviolet (UV) blocking/absorbing layer is provided. The UV blocking layer may be formed on the opposite side of the substrate from the TFTs, or alternatively may be formed as part of the gate insulating layer.

27 Claims, 7 Drawing Sheets

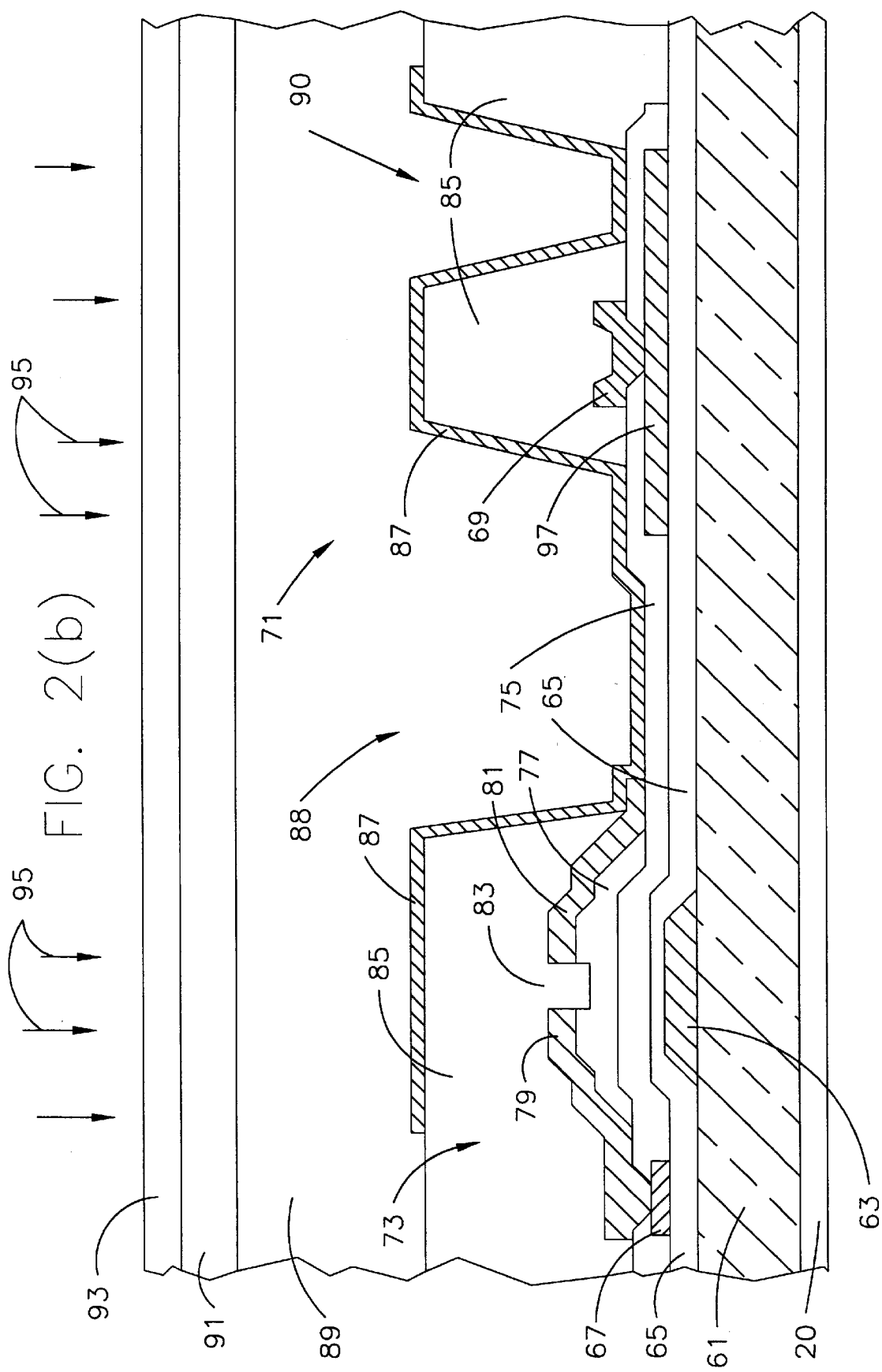

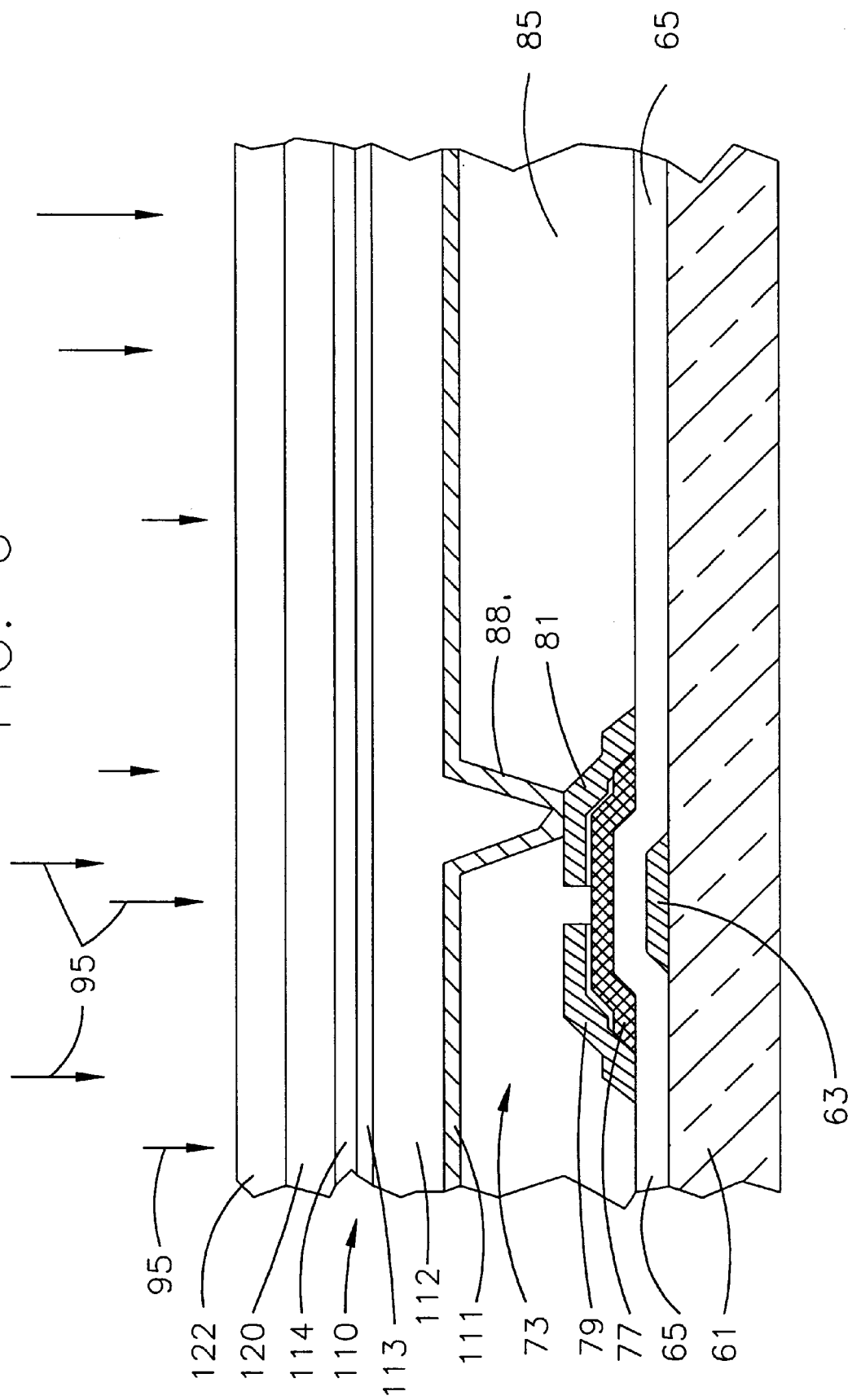

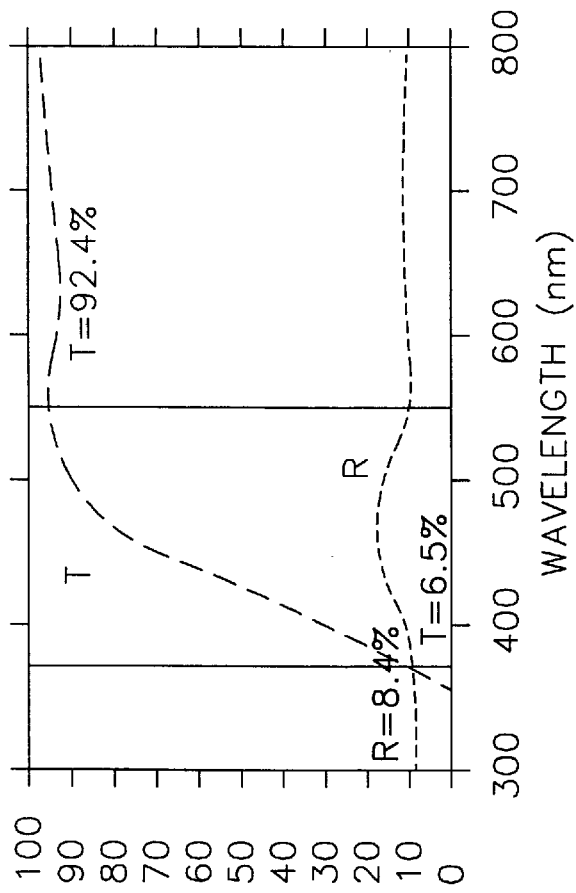
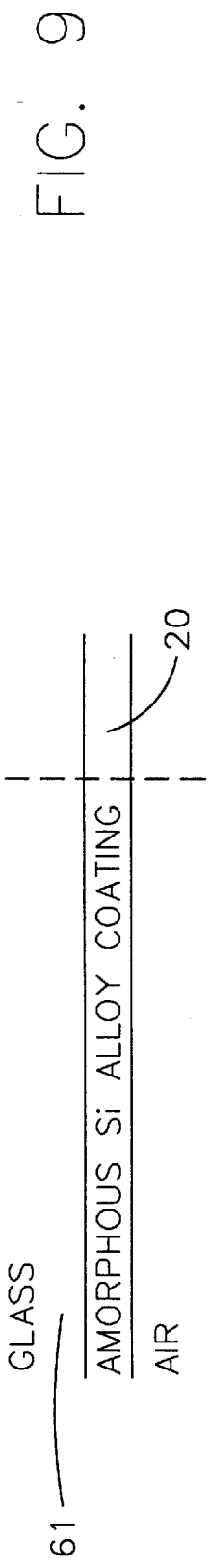
FIG. 9

METHOD OF MAKING A LARGE AREA IMAGER WITH UV BLOCKING LAYER, AND CORRESPONDING IMAGER

This application is related to an application entitled "Large area imager with UV blocking layer" that is commonly owned and filed simultaneously herewith.

This invention relates to a method of making an image sensor including an ultraviolet (UV) ray blocking layer. More particularly, this invention relates to a method of making an imager (e.g. X-ray imager) including an array of TFTs wherein a photo-imageable insulating layer having a plurality of contact vias or apertures disposed therein and a low dielectric constant is located between the address lines and overlapping collector electrodes, and wherein the imager includes a UV blocking layer for reducing the potential for non-uniformities being imaged into the photo-imageable insulating layer.

BACKGROUND OF THE INVENTION

Electronic matrix arrays find considerable application in X-ray image sensors. Such devices generally include X and Y (or row and column) address lines which are horizontally and vertically spaced apart and cross at an angle to one another thereby forming a plurality of crossover points. Associated with each crossover point is an element (e.g. pixel) to be selectively addressed. These elements in many instances are memory cells or pixels of an electronically adjustable memory array or X-ray imager array.

Typically, a switching or isolation device such as a diode or thin film transistor (TFT) is associated with each array element or pixel. The isolation devices permit the individual pixels to be selectively addressed.

Amorphous silicon (a-Si) TFTs have found wide usage for isolation devices. Structurally, TFTs generally include substantially co-planar source and drain electrodes, a thin film semiconductor material (e.g. a-Si) disposed between the source and drain electrodes, and a gate electrode in proximity to the semiconductor but electrically insulated therefrom by a gate insulator. Current flow through the TFT between the source and drain is controlled by the application of voltage to the gate electrode. The voltage to the gate electrode produces an electric field which accumulates a charged region near the semiconductor-gate insulator interface. This charged region forms a current conducting channel in the semiconductor through which current is conducted. Thus, by controlling the voltage to the gate one may read or detect the charge detected by a storage capacitor or photodiode in a corresponding imager pixel. Herein, the TFT electrode which is connected to the pixel electrode or collector electrode is known as the "source."

Image sensors are known in the art. For example, see U.S. Pat. Nos. 5,498,880; 5,396,072; and 5,619,033, the disclosures of which are incorporated herein by reference. See also prior art FIG. 1.

Referring to prior art FIG. 1, a known image detector for capturing digital radiographic images is illustrated. The imager includes a plurality of pixels 3 each including a storage capacitor 7 and a switching thin film transistor (TFT) 5. The storage capacitor 7 in each pixel includes a collector electrode 9 which functions as a top plate of the storage capacitor, and a bottom plate 11 of the capacitor. Charge detectors 29 produce voltage outputs proportional to the charge detected on the corresponding Y address lines when gates are pulsed or energized. A more detailed description of how the FIG. 1 imager functions may be found in U.S. Pat. No. 5,498,880, the disclosure of which is incorporated herein by reference. See also U.S. Pat. Nos. 5,619,033; 4,672,454; 5,079,426; and 5,331,179 for other disclosures of known imagers including arrays of switching elements.

Unfortunately, the imagers of the above-listed patents are susceptible to at least one of the following problems. First, their imaging area is of a lesser area than would otherwise be desirable because the collector electrodes do not overlap the address lines and/or switching devices; or second, if such an overlap is disclosed, the imagers are plagued by undesirably high capacitive cross-talk in the areas of overlap, and the imagers require too many manufacturing steps to make. In view of these two problems, the TFT structure of commonly owned U.S. Pat. No. 5,641,974, which includes a photo-imageable low dielectric passivation layer covering each TFT, has recently been used in the manufacture of X-ray imagers. The insulation or passivation layer of this TFT structure is photo-imageable, in order to reduce the steps needed to make the imagers, and the low dielectric constant of the insulating layer reduces unwanted cross-talk (or noise in imagers). The insulating layer is located between the (1) address lines and TFTs, and (2) overlying electrodes, in order to insulate the electrodes from the address lines/TFTs in areas of overlap.

While this approach has been successful, it is susceptible to the following problem. Because the preferred insulating or passivation layer (e.g BCB or Fuji Clear™) is substantially transparent to all wavelengths of light, including ultraviolet (UV) rays, UV rays used during the manufacturing process to expose or pattern the photoimageable insulating layer are often reflected back toward the imager by the stage of the stepper used in the manufacturing process. For example, when the insulating layer is of the negative resist type and is exposed to UV radiation during manufacturing by an i-line stepper using wavelengths of about 365 nm to pattern vias in the insulating layer, some of the UV radiation is transmitted through the insulating layer and imager and is then reflected by the stepper's stage back toward and through the same insulating layer. This type of reflection, at exposure energies of from about 200–300 mJ/cm$^2$ for example, can cause mechanical features (or non-uniformities) in the stage (e.g. holes, shapes, grooves, imperfections, etc.) to be inadvertently imaged into the insulating layer, thereby resulting in such non-uniformities being visible in final X-ray images. This is undesirable. To reduce this effect, the exposure energy of the stepper can be decreased to about 100 mJ/cm$^2$. Unfortunately, such reduction prevents sufficient cross-linking of the polymer insulating layer during exposure and causes partial removal of the polymer by the developer; and developer streaks and rings are likely to occur under such conditions. As a result, the process window is narrow when a photo-imageable polymer is used that has significant transmittance for UV light (i.e. the process and resulting product are susceptible to non-uniformities being inadvertently imaged into the polymer insulating layer).

It is apparent from the above that there exists a need in the art for an improved method for manufacturing a large area radiation imager including a photo-imageable insulating layer, wherein the adverse effect of UV rays emitted during manufacture are reduced so that inadvertent imaging of patterns or non-uniformities into the insulating layer is minimized. The method, and resulting product, should include a UV radiation protective (i.e. blocking/absorbing) layer in order to minimize the potential of the above-discussed problems.

It is a purpose of this invention to fulfill the above-described needs in the art, as well as other needs which will become apparent to the skilled artisan from the following detailed description of this invention.

SUMMARY OF THE INVENTION

Generally speaking, this invention fulfills the above-described needs in the art by providing a method of making a large area imaging device (e.g. X-ray imager) including an array of semiconductor switching elements (e.g. TFTs or diodes), the method comprising the steps of:

providing a substrate;

forming an array of semiconductor based switching elements and corresponding address lines on the substrate;

depositing an organic photoimageable insulating layer having a dielectric constant value of less than about 5.0 onto the substrate over the switching elements, to a thickness of from about 1.0 to 4.0 $\mu$m;

photoimaging the insulating layer in order to form a first group of vias or contact holes therein, each via in the first group corresponding to one of the switching elements;

forming an array of electrodes over the photoimaged insulating layer so that each of the electrodes communicates with one of the switching elements through one of the vias in the insulating layer; and providing a UV-blocking layer for blocking or absorbing ultraviolet (UV) rays (e.g. rays at about 365 nm) so as to reduce the potential for non-uniformities being imaged into the insulating layer.

This invention further fulfills the above-described needs in the art by providing a method of making a TFT structure comprising the steps of:

providing a substrate;

forming an array of TFTs and corresponding address lines on the substrate;

depositing a photoimageable insulating layer having a dielectric constant of less than about 5.0 over each of the TFTs and the corresponding address lines;

patterning the insulating layer in order to form a first array of vias therein;

forming an array of electrodes on the substrate over the patterned insulating layer so that each of the electrodes is in communication with a corresponding TFT through one of the vias; and forming a UV-blocking layer across a substantial portion of the substrate for blocking transmission of UV rays, so that the imaging of non-uniformities into the insulating layer is minimized or eliminated due to the presence of the UV-blocking layer.

In certain preferred embodiments, the UV blocking layer is located on a side of the substrate opposite the side on which the TFTs are located.

In other preferred embodiments, the UV blocking layer is part of the photoimageable insulating layer so that the insulating layer blocks or absorbs at least about 80% of UV rays that impinge upon it.

In further embodiments, the UV blocking layer may be part of a TFT gate insulating layer.

In still further embodiments, the substrate on which the switching elements are formed may include a UV blocking characteristic itself.

IN THE DRAWINGS

Figure 2A:
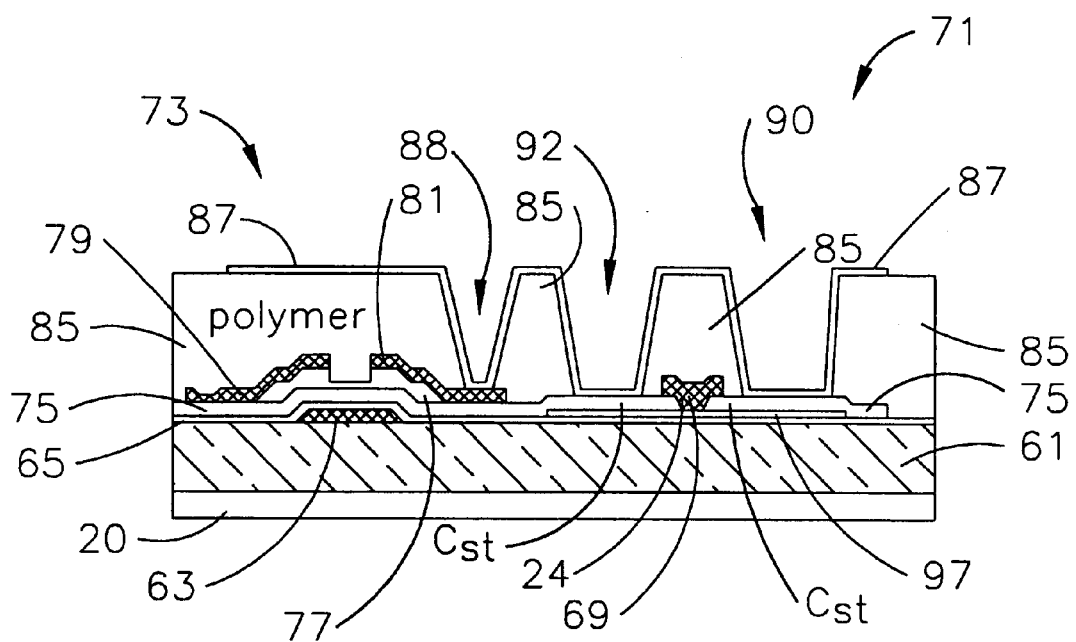
FIG. 2(a) is a side cross sectional view of a pixel of an X-ray imager (not including the overlying X-ray photoconductive layer) in accordance with an embodiment of this invention, this embodiment including a switching TFT and a storage capacitor in each pixel.

FIG. 2(b) is a side cross sectional view of the pixel of an imager according to another embodiment of this invention, the FIG. 2(b) embodiment being similar to that of FIG. 2(a), except that the FIG. 2(a) embodiment includes an additional via or contact hole in the insulating layer in each pixel and the drain address line may be formed along with the TFT drain electrodes. The overlying photoconductive related layers are shown in FIG. 2(b), these overlying layers being used in both the FIG. 2(a) and FIG. 2(b) embodiments.

Figure 3:
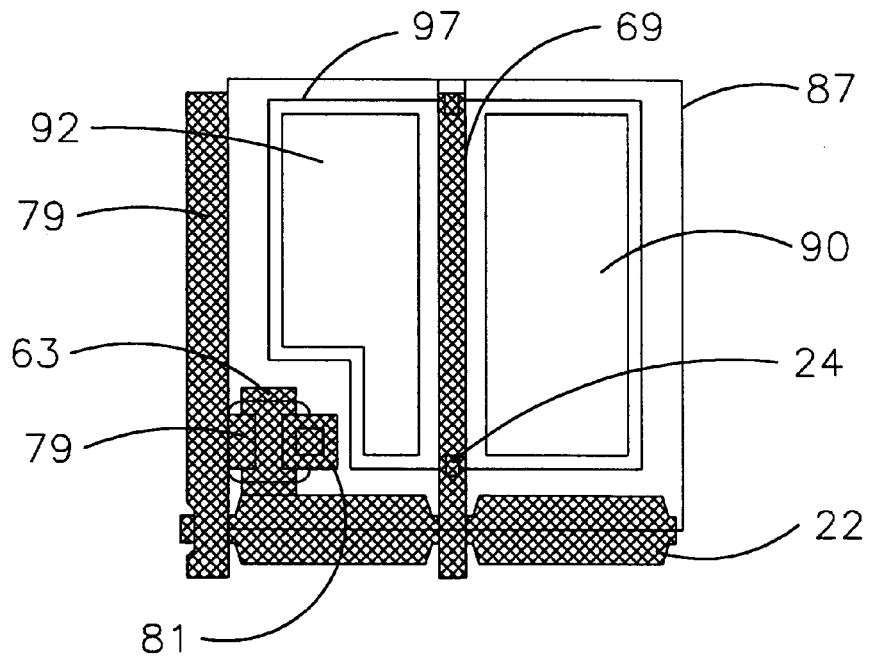

FIG. 3 is a top view of an imager pixel of the FIG. 2(a) embodiment of this invention.

Figure 4:
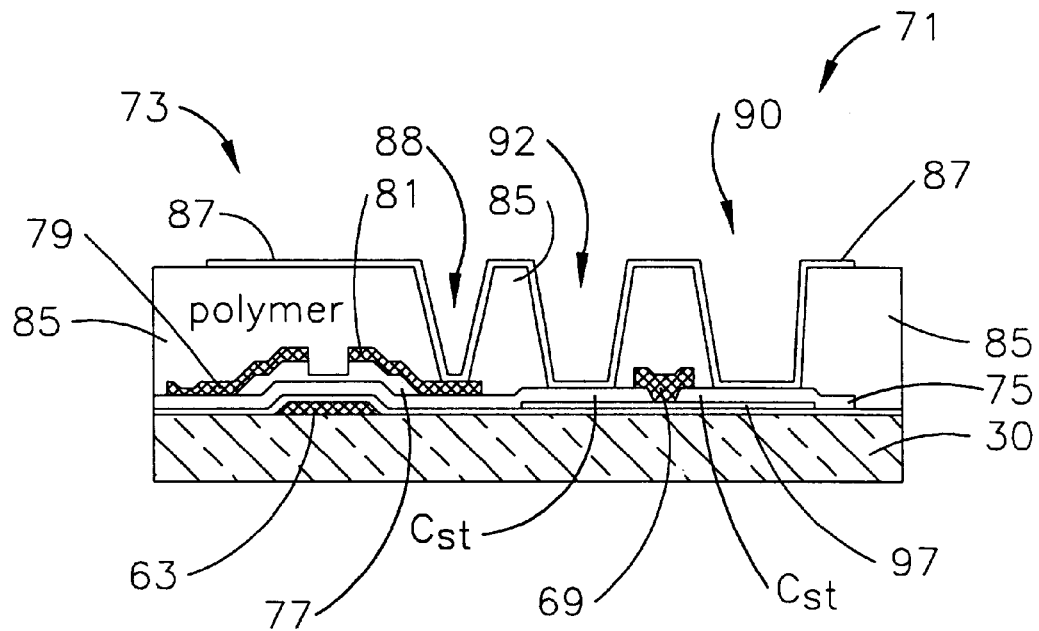

FIG. 4 is a side cross sectional view of the pixel of an X-ray imager according to another embodiment of this invention.

Figure 5:
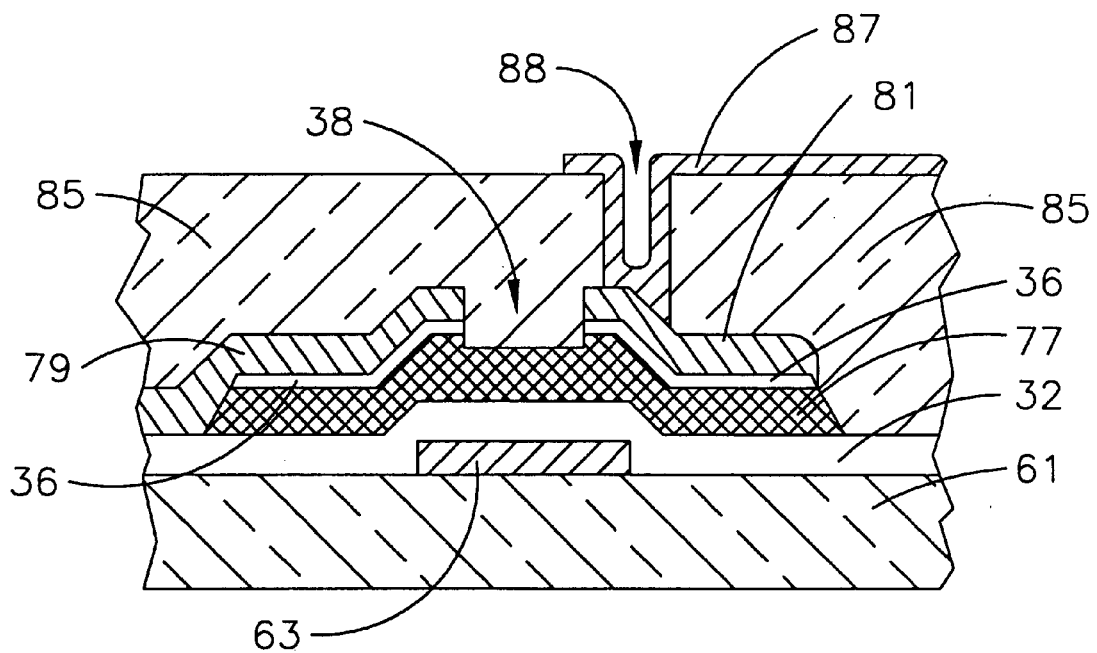

FIG. 5 is a side cross sectional view of the switching TFT structure of an X-ray imager or of a liquid crystal display (LCD) according to an embodiment of this invention, wherein the gate insulating layer includes a UV blocking characteristic or additive material.

FIG. 6 is a side cross-sectional view of an imager pixel according to another embodiment of this invention, wherein a photodiode is used to detect incident radiation.

Figure 7:
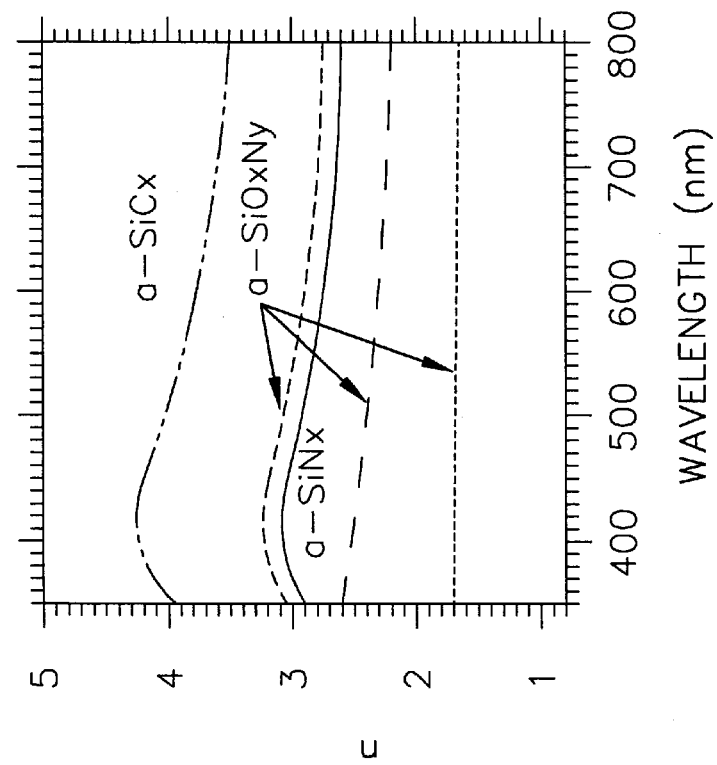

FIG. 7 is a wavelength versus refractive index n graph of different UV-blocking layers according to embodiments of this invention.

Figure 8:
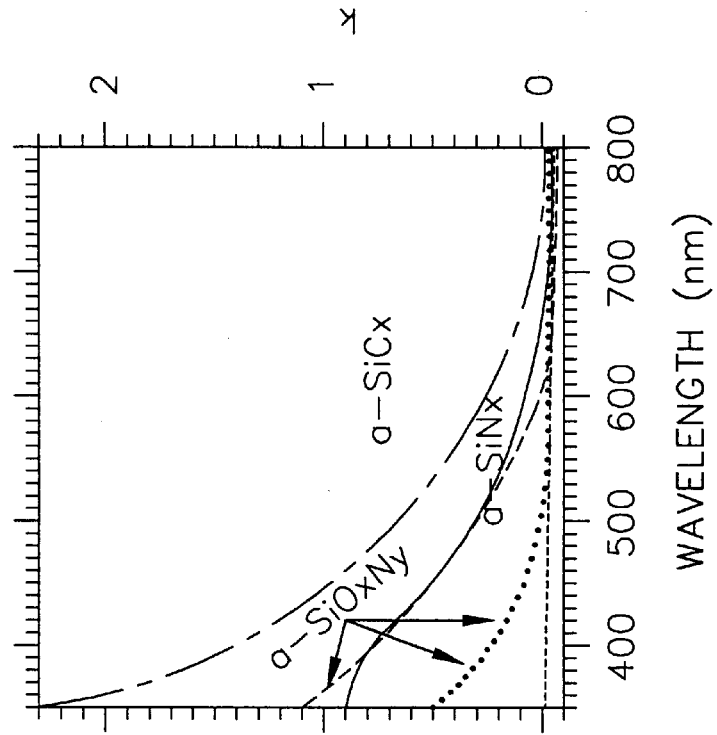

FIG. 8 is a wavelength versus extinction coefficient k graph of different UV-blocking layers according to embodiments of this invention.

FIG. 9 is a transmission/reflection versus wavelength graph, and corresponding schematic, of UV-blocking layers according to this invention.

DETAILED DESCRIPTION OF CERTAIN EMBODIMENTS OF THIS INVENTION

Referring now more particularly to the accompanying drawings in which like reference numerals indicate like parts throughout the several views.

Figure 1:
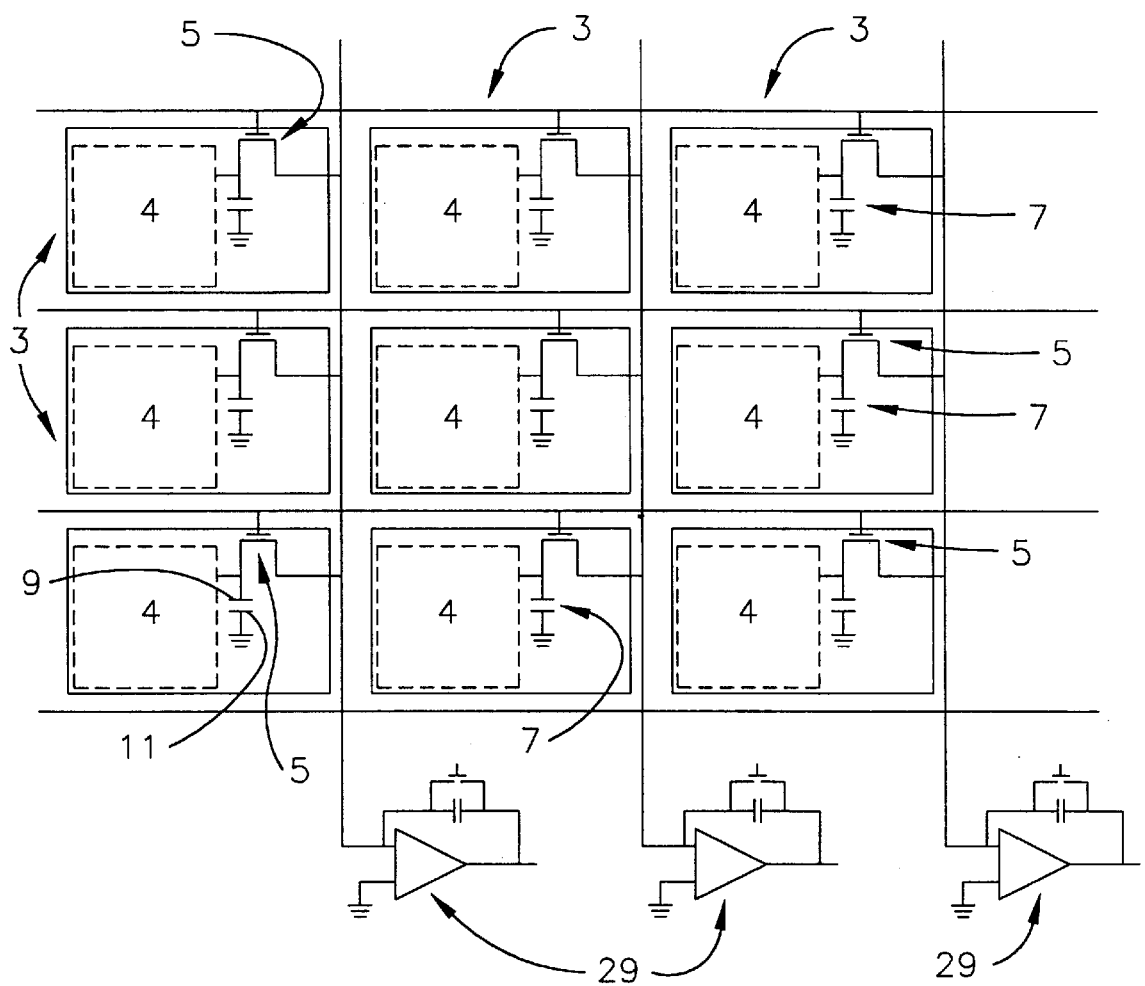
FIG. 1 is a schematic of a prior art imager array wherein each pixel includes a switching TFT and a storage capacitor.

FIGS. 2(a) and 3 illustrate a solid state imager (e.g. X-ray imager) according to an embodiment of this invention. According to this embodiment, insulating or passivation layer 85 is photo-imageable (e.g. a negative resist material) and has a dielectric constant value of less than about 5.0 (preferably less than about 3.5, and most preferably less than about 3.0) in order to reduce parasitic capacitance in overlap areas thereby improving the signal-to-noise ratio of the imager. The photo-imageable nature of TFT passivation/insulation layer 85 reduces the number of steps needed to make the imager. The patterning of vias or contact holes 88, 90, and 92 in layer 85 often requires the use of ultraviolet (UV) radiation. In accordance with this embodiment, an additional UV blocking layer 20 is provided on the opposite side of substrate 61 from the TFTs. UV blocking or attenuating layer 20 reduces the UV radiation or light that is reflected by the corresponding stepper stage back toward the imager and layer 85, thereby reducing the potential for non-uniformities being imaged into insulating layer 85. The presence of UV blocking layer 20 thus allows the use of 200–300 mJ/cm$^2$ exposure energies by the i-line stepper (e.g. at about 365 nm) without imaging unwanted patterns or non-uniformities into layer 85. The resulting process window is thus much larger. The addressing scheme of FIG. 1 may be used to access received image data from the array of FIG. 2(a) pixels.

In order to photo-image the vias into insulating layer 85, an i-line stepper is used in certain embodiments. The stepper includes a UV emitting mercury lamp which emits UV rays at a wavelength, for example, at about 365 nm. The stepper further includes a stage as is known in the art. The UV rays from the stepper proceed toward the imager panel, including the non-patterned layer 85, from above in the FIG. 2(a) drawing and proceed through layer 85 and substrate 61. UV-blocking layer 20 prevents much of the UV rays from going through layer 20 and reaching the stage. The stage reflects any UV which gets through layer 20, and directs some of the reflected light back up toward layer 20 and substrate 61 again. This reflected UV light then hits layer 20 again which filters even more of the UV light out thereby preventing most of the reflected UV light from reaching layer 85. Stopping the UV light that is reflected by the stage from reaching photo-imageable layer 85 minimizes the potential for inadvertently imaging patterns or non-uniformities into layer 85. Thus, it is preferably that the UV blocking layer (according to all embodiments of this invention) blocks a substantial portion of the UV rays that are utilized by the stepper used to photo-image the insulating layer.

Still referring to FIGS. 2(a) and 3, the imager includes substantially transparent substrate 61 (e.g. glass, quartz, plastic, or the like) upon which TFT gate electrode 63, gate insulating layer 65, ground address line 69, storage capacitor 71 including two capacitance portions $C_{st}$, switching thin film transistor (TFT) 73, dielectric layer 75, a-Si semiconductor layer 77, TFT drain electrode and address line 79, gate address line 22 (i.e. row line in FIG. 3), via or contact hole 24 formed in dielectric layer 75, TFT source electrode 81, a TFT channel, photo-imageable passivation or insulating layer 85 for improving the signal-to-noise ratio of the imager, collector electrode 87 (i.e. upper electrode) of storage capacitor 71, and bottom electrode 97 of storage capacitor 71. An array of the FIG. 2(a) and FIG. 3 pixels are provided in an imager.

Not shown in FIG. 2(a) are photoconductive layer 89 (e.g. selenium), dielectric layer 91, and layer 93 which is of conductive material that is substantially transparent to X-ray radiation 95. Layers 89, 91, and 93 are illustrated in FIG. 2(b) and these same layers are to be positioned over top of the imager pixel structure shown in FIG. 2(a).

Still referring to FIGS. 2(a) and 3, each collector electrode 87 is in electrical communication with (preferably contacting) a corresponding TFT source electrode 81 through a via or contact hole 88 defined in substantially transparent insulation layer 85. A first array of vias (or apertures) 88, a second array of vias 90, and a third array of vias 92 are defined in layer 85 across substrate 61. The first array of vias 88 in layer 85 enables the collector electrodes 87 to contact corresponding TFT source electrodes 81, while the second and third arrays of vias or apertures 90 and 92 enable each electrode 87 to form parts of each storage capacitor 71. Vias 90 and 92 in each pixel are located on opposite sides of ground line 69 so that each storage capacitor is divided into a pair of capacitance portions.

During exposure to X-ray radiation (or any other type of applicable radiation), image-wise modulated X-ray radiation impinges upon the imager panel of FIGS. 2(a) and 3. The X-rays generate excess electron hole pairs within the photoconductive layer and, in the presence of the electric field caused by the difference in voltage between the top conducting layer 93 and bottom electrodes 97, holes migrate toward the interface between the photoconductive layer and charge blocking layers immediately adjacent and above the collector electrode 87 in each pixel. The amount of electron hole pairs generated throughout the photoconductive layer is dependent on the intensity of the modulated X-ray radiation impinging upon the panel. When a positive operating voltage is applied to layer 93, barrier dielectric layer 91 prevents holes from being injected into the photoconductive layer from top conductive layer 93. After a predetermined time period, radiation is stopped and the application of operating voltage on layer 93 is removed thereby capturing a radiographic image in the panel in the form of an image-wise modulated charge distribution in storage capacitors 71. Switching devices (e.g. diodes or TFTs 73) are sequentially addressed and made conductive by applying an appropriate voltage to the gate address lines (e.g. x-lines) 22 of the switching devices. This causes the charges stored in the corresponding capacitors 71 to flow through the y-lines to the input of the charge detectors referenced above.

In order to increase the receiving area of the imager and to maximize signal, collector electrodes 87 of the storage capacitors are formed so as to overlap the TFT in each pixel and to overlap at least partially the x address lines and/or the y address lines. In certain embodiments, each collector electrode overlaps the entire source electrode 81 and the channel of the corresponding TFT, and also partially overlaps the adjacent x and y address or bus lines. In certain embodiments, the collector electrode in each pixel overlaps the entire corresponding TFT.

The use of low dielectric constant polymer interlevel dielectric layer 85 reduces parasitic capacitance between the collector electrodes 87 and the TFT and/or address line(s), thereby reducing noise. This also reduces parasitic capacitance between ground line and signal line, another significant contributor of noise. Preferably, insulation layer 85 is from about 1.0 to 4.0 $\mu$m thick on the substrate and most preferably is from about 1.0 to 3.0 $\mu$m thick (a thickness of about 1.7 or 1.8 $\mu$m is preferred. In the case of medical X-ray imaging, an increase in the signal-to-noise ratio (as resulting in accordance with this invention) allows the same information to be obtained at a lower dose to the patient or more information at the same does.

Substantially transparent insulating layer 85 having a dielectric constant less than about 5.0 is deposited as a sheet on substrate 61 so as to cover TFTs 73 and the address lines. Layer 85 is formed of a photo-imageable material such as Fuji Clear™ (an acrylic) or a photo-imageable type of BCB in certain embodiments. Insulating layer 85 is continuous in the viewing area of the imager except for vias or apertures 88, 90, and 92 formed therein.

As discussed above, the patterning of vias 88, 90, and 92 in layer 85 often requires the exposure of the insulating layer to UV radiation. For example, in certain embodiments, in order to form the vias, layer 85 is irradiated by UV rays (e.g. i-rays of about 365 nm) by the i-line stepper, with UV irradiated areas of the insulating layer to remain on the substrate and non-exposed areas of the layer to be removed in developing. Thus, the areas of the negative resist material corresponding to vias 88, 90, and 92 are not exposed to the UV radiation, while the rest of the insulating layer is exposed to the UV emitted by the stepper's lamp.

In the FIG. 2(a) and 3 embodiment of this invention, UV-blocking or attenuating layer 20 is deposited or otherwise provided on the side or surface of substrate 61 opposite the TFTs and storage capacitors. In certain embodiments, UV blocking layer may be of a silicon-rich (Si-rich) silicon nitride layer with an optical gap of from about 1.7 to 3.0 eV. Most preferably, UV blocking layer 20 has an optical gap of from about 2.0 to 2.5 eV. It is noted that if the optical gap of layer 20 gets too low (e.g. around 1.0), then visible light will begin to be absorbed in addition to the UV. Layer 20 has a thickness of from about 200 to 2000 Å in certain embodiments.

According to other embodiments, UV blocking or attenuating layer 20 may be of amorphous silicon (a-Si), or of a Si-rich silicon oxide, with the optical gap characteristics discussed above in order to absorb or block UV substantial portions of UV radiation. When a-Si alone is used as layer 20, the layer is preferably only a few hundred Å thick, but when a-Si rich silicon nitride is used as layer 20 the layer is preferably about 1000 Å thick. The addition of the a-Si to silicon oxide or silicon nitride provides a layer that has enhanced UV blocking or absorbing characteristics, but which is still substantially transparent to many visible wavelengths. This is important because imagers according to certain embodiments of this invention are optically reset with visible light (e.g. green light) that is directed toward the photoconductive layer.

In certain embodiments, transmission of certain UV rays through UV blocking layer 20 is only from about 0–40%, preferably only from about 0–20% (i.e. layer 20 blocks at least about 80% of the UV rays from proceeding therethrough), and most preferably from about 0–10% (i.e. layer 20 blocks at least about 90% of the UV rays, and even more than 95% in certain embodiments). Thus, when transmission of the stepper's UV rays (e.g. i-rays at about 365 nm) through layer 20 is about 10%, then only about 1% of the UV light originating from the UV mercury lamp of the stepper is reflected back through layer 20 into layer 85, since the UV radiation must pass twice through UV blocking layer 20 in order to reach layer 85 on reflection.

Referring now to FIGS. 7–9, different UV-blocking layers 20 will be described. As discussed above, when a transparent substrate such as glass 61 is used in displays or imagers, reflection from the glass second surface and from the stage of the lithography tool (e.g. stepper) can decrease the equipment resolution and inadvertently introduce undesired patterns into photoimageable or photosensitive materials such as insulating layer 85. The deposition of a single or multiple layer 20 amorphous Si allow on the backside of substrate 61 can solve this problem by destructive interference and absorption. Oxygen, carbon, or nitrogen can be introduced to amorphous Si source by adding different gases containing those elements to obtain the desired complex refractive index spectra of layer 20. Those films 20 can be deposited with either PECVD or by sputtering. Amorphous Si alloy can have a much higher extinction coefficient, k, and refractive index, n, in the short wavelength used in lithography than the visible light wavelength (see FIGS. 7-8). By using this unique behavior, an extra coating or layer 20 on the backside of substrate 61 can compress the reflectance of short wavelengths during lithography by absorption which is proportional to k and enhance the visible light transmittnce from the bottom of the substrate after completion of imager of display process by constructive interference (see FIG. 9). As can be seen in FIG. 9, transmittance through layer 20 and substrate 61 is at least about 90% for certain visible wavelengths and reflection is less than about 10% for many UV and visible wavelengths. However, transmittance through layer 20 is low (e.g. less than about 10%) for certain UV wavelengths.

Layer 85 may be of a photo-imageable material known as Fuji Clear™, which is an organic mixture including 2-Ethoxyethyl acetate (55–70%), methacrylate derivative copolymer (10–20%), and polyfunctional acrylate (10–20%). Alternatively, a photo-imageable type of BCB can be used as layer 85. The 2-ethoxyethyl acetate is a solvent which is removed during spinning and/or curing, and thus does not make its way into the final product.

Referring now to FIGS. 2(a) and 3, it will be described how the imager including the array of TFT structures and corresponding address lines is made according to an embodiment of this invention. Firstly, substantially transparent substrate 61 (e.g. of glass) is provided. UV blocking or attenuating layer 20 is deposited on one side or surface of substrate 61, opposite the side on which the TFTs are to be formed. Layer 20 is preferably deposited via plasma enhanced CVD (chemical vapor deposition), over the entire rear surface of substrate 61, or at least in the imaging area where pixels are to be formed on the other side. Layer 20 preferably includes silicon nitride, with a UV-absorbing additive such as a-Si.

Then, at least one gate metal (e.g. Al and/or Ta) is deposited on the other side of substrate 61 and patterned and etched in the form of gate electrodes 63 and gate address lines 22. A photoresist may be used. The gate metal(s) is/are deposited on the substrate to a thickness of from about 1,000–5,000 Å. The gate metal sheet is deposited by way of sputtering or vapor deposition, and is dry etched (preferably using reactive ion etching) in order to pattern the gate metal layer in accordance with the retained photoresist pattern. To do this, the structure is mounted in a known reactive ion etching (RIE) apparatus which is then purged and evacuated in accordance with known RIE procedures and etchants.

After gate address lines are deposited and patterned on top of substrate 61 in the above-described manner, it is optional for a gate insulating or dielectric layer 65 to be deposited over substantially the entire substrate 61 preferably by plasma enhanced chemical vapor deposition (CVD) or some other process known to produce a high integrity dielectric. Gate insulating layer 65 is preferably silicon nitride ($Si_3N_4$) but may also be silicon dioxide or other known dielectrics. Gate insulating layer 65 is deposited to a thickness of from about 500–3,000 Å (preferably either about 1,000 Å) according to certain embodiments. Again, gate insulating layer 65 is optional, and may not be utilized.

Then, bottom electrode ITO layer (which results in bottom storage capacitor electrodes 97) is deposited on the substrate to a thickness of about 1200 Å, and thereafter etched to form the array of bottom or ground electrodes 97. Then, dielectric layer (which results in layer 75), preferably silicon nitride, is deposited over the bottom electrodes 97 to a thickness of about 2000 Å. This layer which results in layer 75 may be the sole gate insulator in certain embodiments (i.e. layer 65 is optional).

Next, semiconductor (e.g. intrinsic a-Si) layer 77 is deposited on the substrate to a thickness of about 2,000 Å. Semiconductor layer 77 may be from about 1,000 Å to 4,000 Å thick in certain embodiments of this invention. Then, a doped (typically phosphorous doped, that is n+) amorphous silicon contact layer is deposited over intrinsic a-Si layer 77 in a known manner to a thickness of, for example, about 500 Å. The doped contact layer may be from about 200 Å to 1,000 Å thick according to certain embodiments of this invention.

Following this formation, the TFT island or area may be formed by way of etching, for example, so that the TFT metal source/drain layers can be deposited thereon. For example, RIE may be used to etch the silicon semiconductor layers, and thereafter the silicon nitride (or other dielectric material) 75 is exposed to RIE to form the illustrated contact vias 24 therein and to pattern the dielectric 75. Contact vias 24 in dielectric layer 75 are formed thereby allowing a ground line 69 to contact a corresponding bottom storage capacitor electrode 97 in each pixel.

According to preferred embodiments, following the formation of the TFT islands and vias 24 in dielectric layer 75, a source-drain metal sheet or layer of MoTa or the like (which results in drains 79, drain address lines, sources 81, and ground address lines 69) is deposited on substrate 61 over top of patterned semiconductor layer 77 and dielectric layer 75. When MoTa, this metal layer is deposited to a thickness of about 1,000–7,000 Å, preferably about 5,000 Å according to certain embodiments. The deposited source drain metal layer sheet is then patterned (masked and etched) to form the array of source electrodes 81, the array of drain electrodes 79, the drain address lines, and ground lines 69. After patterning of drain and source portions, the a-Si n+ contact layer (shown only in FIG. 5) is etched in the TFT channel area and inevitably a bit of semiconductor layer 77 is etched along with it.

Substantially transparent polymer insulating layer 85 is then deposited onto substantially the entire substrate 61 by way of spin-coating according to certain embodiments of this invention. Preferably, layer 85 is of a photo-imageable acrylic polymer material. Insulating layer 85 fills recesses generated upon formation of TFTs and flattens the surface above substrate 61 at least about 60–80% according to certain embodiments. This layer 85 is also deposited so that it covers ground lines 69 and is located over the storage capacitor areas on the substrate. Layer 85 is deposited to a thickness of from about 1.0 to 4.0 μm, preferably about 1.8 μm.

Photo-imageable insulating layer 85 acts as a negative resist layer according to certain embodiments of this invention so that no additional photoresist is needed to form vias 88, 90, and 92 in layer 85. In order to form the vias, layer 85 is irradiated by ultraviolet (UV) rays (e.g. i rays of 365 nm) with the i-line stepper including its stage, with UV irradiated areas of layer 85 to remain and non-exposed or non-radiated areas of layer 85 to be removed in developing. A mask may be used. Thus, the areas of negative resist 85 corresponding to vias or apertures 88, 90, and 92 are not exposed to the UV radiation, while the rest of the layer 85 across the substrate is exposed to UV. UV blocking or attenuating layer 20 absorbs or blocks a substantial amount of the UV rays (e.g. more than about 60% are blocked, and preferably more than about 80%, and most preferably more than about 90% are blocked from transmission), thereby preventing much of the UV radiation from reaching the stage of the stepper. Then, that UV radiation which reaches the stage and is reflected thereby and directed back toward the imager again impinges upon layer 20 a second time, but from the other direction. Layer 20 again blocks the same percentage of UV rays thereby minimizing unwanted patterns, non-uniformities, or the like from being inadvertently imaged into layer 85.

Following exposure of layer 85 (except in the via areas), layer 85 is developed by using a known developing solution at a known concentration. In the developing stage, the areas of layer 85 corresponding to vias 88, 90, and 92 are removed (i.e. dissolved) so as to form the illustrated vias in insulating layer 85. After developing, resist insulating layer 85 is cured or subjected to postbaking (e.g. about 240 degrees C for about one hour) to eliminate the solvent so that the layer 85 with the vias therein is resinified. Thus, no dry or wet etching is needed to form the vias in layer 85. According to alternative embodiments, layer 85 may be a positive resist as opposed to a negative resist.

Vias or apertures 88 are formed in layer 85 over top of (or adjacent) each source metal electrode 81 so as to permit the collector electrodes 87 to electrically contact corresponding source electrodes through vias 88. Vias 90 and 92 permit electrodes 87 to form part of the storage capacitors 71, whereby these two vias or apertures in layer 85 define the area of the storage capacitor 71 top electrode in each pixel.

After the vias are formed in layer 85, a substantially transparent conductive layer (e.g. indium-tin-oxide or ITO) which results in electrodes 87 is deposited and patterned (e.g. photomasked and etched) over top of layer 85. After patterning of this substantially transparent conductive layer, collector electrodes 87 are left as shown in FIGS. 2(a) and 3. In each pixel an electrode 87 contacts a TFT source electrode 81 and a storage capacitor dielectric 75 as shown in FIG. 2(a). The material for forming electrodes 87 is substantially transparent (when made of ITO) and is deposited to a thickness of from about 1,000 to 3,000 Å (preferably about 1,200 Å) according to certain embodiments of this invention. Other known materials may be used as the upper capacitor electrode layer. Collection electrodes 87 in the array may be separated by about 10 μm from each other, and each electrode 87 covering about 86% of the pixel area including the TFT in each pixel in the array. Preferably, electrode 87 covers at least about 80% of the pixel area on the imager panel, and most preferably at least about 85%.

After the structure shown in FIGS. 2(a) and 3 is formed, a photoconductive layer (e.g. Se) 89, a dielectric layer 91, and a top conducting layer 93 are formed on the substrate 61 in order to complete the X-ray imager.

FIG. 2(b) illustrates another embodiment of this invention, including UV blocking layer 20 on the rear side of substrate 61. The FIG. 2(b) embodiment is similar to the FIG. 2(a) embodiment, except that in the FIG. 2(b) embodiment there are only two vias 88 and 90 formed in layer 85 and drain address lines 67 are formed of the same material (and from the same base layer) as bottom electrodes 97. Thus, an extra via or contact hole is formed in layer 75 in each pixel in the FIG. 2(b) embodiment so that drain electrodes 79 are allowed to contact drain lines 67 through these extra vias. As shown in FIG. 2(b), via 88 both permits the collector electrode 87 to contact source 81 and also permits electrode 87 to form part of the storage capacitor in each pixel.

FIG. 4 illustrates an imager pixel according to another embodiment of this invention, wherein the UV blocking material is formed integrally with and as part of substrate 30. In this embodiment, a different type of substrate 30 is provided in order to at least partially block or attenuate UV radiation for the reasons set forth above. For example, a UV blocking substrate (blocking at least about 60% of UV rays, preferably at least about 80%, and most preferably at least about 90% of UV rays) 30 is provided so that layer 20 is not needed. Such a UV blocking glass substrate may be obtained as Corning code: DFR Sharp UV Cutoff. In certain embodiments, UV blocking substrate 30 is less than about 10% transparent to wavelengths less than approximately 400 nm and is more than about 90% transparent to wavelengths greater than approximately 400 nm (i.e. like this Corning glass is). Optionally, the UV blocking substrate 30 may be used in conjunction with UV blocking layer 20 in certain embodiments of this invention.

According to yet another embodiment of this invention, substrate 30 in FIG. 4 may be substantially transparent to UV and visible light as in the prior art, and layer 85 may be of a UV absorbing photo-imageable acrylic material such as Fuji Green™ (available from Fuji). Thus, layer 85 may be of a material capable of absorbing at least about 60% of UV rays (e.g. i-rays at about 365 nm), preferably at least about 80%, and most preferably at least about 90% of UV rays. This photoimageable Fuji Green material is a photoimageable polymer acrylic, and is a negative resist type of material. Layer 85 in this embodiment is still substantially transmissive to green visible light (e.g. from about 500–600 nm is mostly transmissive) so that photoconductive layer 89 can be optically reset by green visible light emitted from a backlight positioned behind the rear side of the substrate. In a preferred form of this embodiment, layer 85 is substantially transparent to certain visible green rays, and is substantially opaque or blocking of all other visible and UV rays.

FIG. 5 is a side cross-sectional view of a TFT structure of an imager or of an LCD according to another embodiment of this invention, wherein the UV-blocking layer includes gate insulator 32. The TFT structure of FIG. 5 may replace the TFT in any of the FIG. 2(a), 2(b), or 4 embodiments of this invention, and thus may be used as a switching element in an imager pixel, and the photoconductive layer 89, dielectric 91, and top conductive layer 93 may be provided over the FIG. 5 structure. In this embodiment, the structure includes substrate 61 which is substantially transparent to visible and UV rays, gate electrode 63, UV-blocking gate insulating layer 32, intrinsic a-Si semiconductor layer 77, doped contact layer 36, TFT drain electrode and address line 79, TFT channel 38, TFT source 81, photo-imageable insulating layer 85, via 88 defined in layer 85, and electrode 87. Here, gate insulating layer 32 includes a basic dielectric material such as silicon nitride or silicon oxide, with a UV absorbing material (e.g. a-Si) added thereto so that layer 32 acts as a UV absorbing layer for the reasons discussed above. In certain embodiments, UV blocking and gate insulating layer 32 may be of a silicon-rich (Si-rich) silicon nitride layer with an optical gap of from about 1.7 to 3.0 eV, the optical gap preferably being from about 2.0–2.5 eV. In certain embodiments, a-Si is added to silicon nitride, silicon oxide, or some other appropriate dielectric so that the resulting layer 32 has an optical gap as described above, is substantially transparent to green visible wavelengths, and substantially blocks UV rays (e.g. 365 nm) to the extent discussed above. Also, layer 32 in this embodiment is preferably substantially transparent to green visible light (e.g. visible wavelengths including at least some green wavelengths within the range of 500–600 nm), so that the backlight is able to optically reset the photoconductive layer (e.g. of Se). In imager embodiments in accordance with FIG. 5, the top collector electrode 87 preferably extends over the TFT channel and at least part way over the drain 79.

The TFT structure of FIG. 5 may also be used in LCD applications, where electrode 87 is a pixel electrode in a pixel of the display. See U.S. Pat. No. 5,641,974 for LCD embodiments, the disclosure of which is incorporated herein by reference. Layer 32 is provided so as to both insulate gate 63 and serve as the UV blocking layer for the reasons discussed above. In LCD embodiments, liquid crystal material is positioned above electrode 87 so as to be sandwiched between substrate 61 and another opposing substrate. The UV blocking layer 32 reduces the chances of an undesirable image or pattern being imaged into layer 85 during the manufacturing process, as UV reflections off of the stepper stage which reach layer 85 are substantially reduced by layer 32.

FIG. 6 is a side cross-sectional view of another embodiment of this invention. The embodiments of FIGS. 2–4 are of the "direct" imager approach wherein an X-ray photoconductor 89 such as Se or $PbI_2$ converts incoming X-ray photons directly into charge that is collected in the storage capacitors, and sequentially read out via the TFTs or other switching elements. However, in contrast to the previous embodiments, the FIG. 6 embodiment relates to an "indirect" imager wherein a photodiode 110 sensor array and corresponding readout TFT 73 matrix is provided in conjunction with a phosphor screen or scintillator layer (e.g. CsI), as shown and discussed in U.S. Pat. No. 4,672,454, the disclosure of which is incorporated herein by reference. The scintillator layer converts incoming X-ray photons into visible light which is detected by the array of photodiodes 110 and read out by the TFT switching matrix. In addition to the TFT and address line elements described above in other embodiments, each pixel in the FIG. 6 embodiment further includes a PIN photodiode 110 (e.g. a-Si PIN photodiode) including n+ doped layer 111, intrinsic a-Si:H layer 112, and p+ doped layer 113. Each pixel further includes conductive layer 114, scintillating layer 120, and optionally metal layer 122. In this FIG. 6 embodiment, insulating layer 85 is also photo-imageable low dielectric material as described above, and is positioned over the switching elements (e.g. TFTs 73) and address lines and beneath the photodiodes 110. The UV-blocking aspect of this embodiment may be any one of (i) integrally formed with substrate 61 so that the substrate includes a UV blocking agent or characteristic, (ii) gate insulating layer 65 may include not only an insulating material such as silicon nitride or silicon oxide, but also a UV blocking additive such as a-Si which allows this layer to preferably block UV rays as discussed previously, or (iii) a separate UV blocking layer may be deposited on the side of substrate 61 opposite the TFTs as in the FIG. 2(a) embodiment.

Each of the embodiments illustrated and discussed above includes a bottom gate TFT as the switching element in each pixel. However, it will be appreciated that instead of a bottom gate TFT, in alternative embodiments applicable to all embodiments herein, top gate switching TFTs or diodes may be used as switching elements.

Once given the above disclosure, many other features, modifications, and improvements will become apparent to the skilled artisan. Such other features, modifications, and improvements are, therefore, considered to be a part of this invention, the scope of which is to be determined by the following claims.

We claim:

1. A method of making a radiation imager including a thin film transistor (TFT) array, the method comprising the steps of:

providing a substrate;

forming a UV-blocking layer on a first side of the substrate for blocking substantial amounts of ultraviolet (UV) rays from passing therethrough;

forming a plurality of TFT gate electrodes connected to gate lines on a second side of the substrate;

providing a gate insulating layer over the gate electrodes on the second side of the substrate;

forming and patterning a semiconductor layer on the second side of the substrate over each of the gate electrodes in TFT areas;

forming TFT source and drain electrodes in each TFT area with a TFT channel therebetween, and providing a plurality of corresponding drain lines, thereby forming an array of TFTs on the second side of the substrate;

depositing a photo-imageable insulating layer over a substantial portion of the second side of the substrate so as to cover substantial portions of the gate and drain lines and the TFTs in the array;

photo-imaging the insulating layer so as to form a plurality of vias or apertures therein, at least one via corresponding to each TFT in the array;

forming a plurality of collector electrodes over the insulating layer on the second side of the substrate so that each collector electrode is in communication with the source electrode of a corresponding TFT through one of the vias;

forming the collector electrodes on the second side of the substrate so that each collector electrode overlaps at least one of the drain and gate lines whereby the collector electrodes are insulated from overlapped lines in overlap areas by the photo-imaged insulating layer;

providing a photoconductor layer over the TFTs and collector electrodes on the second side of the substrate so that storage capacitors formed in part by the collector electrodes store charge in amounts that are functions of incident radiation received by the imager and the collecting electrodes; and wherein the UV-blocking layer minimizes the potential for undesirable patterns to be inadvertently imaged into the photo-imageable insulating layer.

2. The method of claim 1, wherein the steps recited are performed in the order recited.

3. The method of claim 1, wherein the UV-blocking layer has an optical gap of from about 1.7 to 3.0 eV.

4. The method of claim 3, wherein the UV-blocking layer has an optical gap of from about 2.0 to 2.5 eV.

5. The method of claim 1, wherein the UV-blocking layer includes each of (i) amorphous silicon (a-Si), and (ii) one of silicon nitride and silicon oxide.

6. The method of claim 1, wherein the UV-blocking layer blocks or otherwise stops at least about 80% of UV light rays at about 365 nm from being transmitted therethrough should they impinge upon the UV-blocking layer.

7. The method of claim 6, wherein the UV-blocking layer blocks or otherwise stops at least about 90% of UV light rays at about 365 nm from being transmitted therethrough should they impinge upon the UV-blocking layer.

8. The method of claim 6, further including the steps of:

depositing the insulating layer as a negative resist to a thickness of from about 1.0 to 3.0 $\mu$m;

irradiating the negative resist insulating layer with ultraviolet (UV) rays; and developing the irradiated negative resist insulating layer so as to remove areas which were not exposed to the UV rays thereby forming the vias in the insulating layers.

9. The method of claim 8, further including the step of depositing the insulating layer so as to include photo-imageable benzocyclobutene (BCB) which is an organic material, thereby reducing capacitive cross-talk between the pixel electrodes and the lines in the overlap areas.

10. The method of claim 8, further comprising the step of depositing the insulating layer so that the insulating layer has a dielectric constant less than about 5.0.

11. The method of claim 10, further comprising the step of depositing the insulating layer so that the insulating layer has a dielectric constant less than about 3.5.

12. The method of claim 8, further comprising depositing the insulating layer including 2-Ethoxyethyl acetate.

13. The method of claim 8, wherein the insulating layer includes an organic mixture of methacrylate derivative copolymer, and polyfunctional acrylate.

14. A method of making a large area imaging device including an array of semiconductor switching elements, the method comprising the steps of:

providing a substrate;

forming an array of semiconductor based switching elements and corresponding address lines on the substrate;

depositing an organic photo-imageable insulating layer having a dielectric constant value of less than about 5.0 onto the substrate over the switching elements, to a thickness of from about 1.0 to 4.0 $\mu$m;

photo-imaging the insulating layer in order to form a first group of vias or contact holes therein, each via in the first group corresponding to one of the switching elements;

forming an array of electrodes over the photo-imaged insulating layer so that each of the electrodes communicates with one of the switching elements through one of the vias in the insulating layer; and providing a UV-blocking layer for blocking or absorbing ultraviolet (UV) rays so as to reduce the potential for non-uniformities being imaged into the insulating layer.

15. The method of claim 14, further comprising the step of providing the UV-blocking layer as integral with and part of the substrate.

16. The method of claim 14, further comprising the step of providing the UV-blocking layer as a layer on the side of the substrate opposite the side of the substrate that has the switching elements mounted thereon, so that the substrate is located between the UV-blocking layer and the switching elements.

17. The method of claim 14, wherein the switching elements are thin film transistors (TFTs), and further comprising the step of providing the UV-blocking layer as a layer which functions as both a TFT gate insulating layer and as the UV-blocking layer.

18. The method of claim 14, further comprising the step of providing the UV-blocking layer as integral with and part of the photo-imageable insulating layer, wherein UV transmission through the photo-imageable insulating layer is less than about 20%.

19. The method of claim 18, wherein UV transmission at 365 nm through the photo-imageable insulating layer is less than about 20%.

20. The method of claim 18, wherein UV transmission through the photo-imageable insulating layer is less than about 10%, and wherein the insulating layer has an optical gap of from about 1.7 to 3.0 eV.

21. The method of claim 18, wherein UV transmission at about 365 nm through the insulating layer is less than about 20%, and wherein the insulating layer is substantially transmissive to certain green colored visible light wavelengths, but is substantially non-transmissive to certain red and blue visible light wavelengths.

22. A method of making a thin film transistor (TFT) structure, the method comprising the steps of:

providing a substrate;

forming an array of TFTs and corresponding address lines on the substrate;

depositing a photo-imageable insulating layer having a dielectric constant of less than about 5.0 over each of (i) the TFTs, and (ii) the corresponding address lines;

patterning the insulating layer in order to form a first array of vias therein;

forming an array of electrodes on the substrate over the patterned insulating layer so that each of the electrodes is in communication with a corresponding TFT through one of the vias; and providing a UV-blocking layer across a substantial portion of the substrate for blocking transmission of UV rays, so that the imaging of non-uniformities into the insulating layer is minimized or eliminated.

23. The method of claim 22, further comprising forming the UV-blocking layer on a side of the substrate opposite the TFTs so that the substrate is located at a position between the TFTs and the UV-blocking layer.

24. The method of claim 22, further comprising forming the UV-blocking layer as part of the photo-imageable insulating layer so that the photo-imagable insulating layer blocks or absorbs at least about 80% of UV rays that impinge thereon.

25. The method of claim 22, further comprising forming the UV-blocking layer as part of a gate insulating layer so that the gate insulating layer both insulates gate electrodes of the TFTs and acts as a UV-blocking layer for blocking at least about 80% of about 365 nm rays from transmission therethrough, should such rays impinge upon the blocking layer.

26. The method of claim 22, wherein the TFT structure is for use in one of an X-ray imager and a liquid crystal display.

27. The method of claim 22, further comprising the step of using a UV-emitting stepper to photoimage the insulating layer so that UV rays that are emitted from the stepper impinge upon the insulating layer in order to photoimage the insulating layer, and wherein the UV-blocking layer blocks or absorbs at least about 90% of the UV rays emitted by the stepper.

* * * * *